United States Patent
Ryan et al.

(10) Patent No.: US 8,623,758 B1
(45) Date of Patent: Jan. 7, 2014

(54) SUBTRACTIVE METAL MULTI-LAYER BARRIER LAYER FOR INTERCONNECT STRUCTURE

(71) Applicant: GLOBALFOUNDRIES Inc., Grand Cayman, KY (US)

(72) Inventors: Vivian W. Ryan, Berne, NY (US); Xunyuan Zhang, Albany, NY (US); Paul R. Besser, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/657,182

(22) Filed: Oct. 22, 2012

(51) Int. Cl.
*H01L 21/4763* (2006.01)

(52) U.S. Cl.
USPC .................................. 438/627; 257/E21.564

(58) Field of Classification Search
USPC ............ 438/618, 627, 628; 257/753, E23.16, 257/E21.584
See application file for complete search history.

(56) References Cited

U.S. PATENT DOCUMENTS

| | | | |
|---|---|---|---|
| 6,207,558 B1 | 3/2001 | Singhvi et al. | |
| 6,534,865 B1 | 3/2003 | Lopatin et al. | |
| 8,319,208 B2 | 11/2012 | Sorenson et al. | |
| 2005/0272254 A1* | 12/2005 | Ding et al. | 438/628 |
| 2006/0071350 A1* | 4/2006 | Fan et al. | 257/784 |
| 2010/0200991 A1 | 8/2010 | Akolkar et al. | |
| 2012/0001330 A1 | 1/2012 | Huisinga et al. | |

OTHER PUBLICATIONS

Office Action from related U.S. Appl. No. 13/554,020 dated Jan. 30, 2013.
Office Action from related U.S. Appl. No. 13/553,977 dated May 21, 2013.

\* cited by examiner

*Primary Examiner* — Brook Kebede
(74) *Attorney, Agent, or Firm* — Williams, Morgan & Amerson, P.C.

(57) ABSTRACT

A method includes forming an adhesion barrier layer over a dielectric layer formed on a substrate. A first stress level is present across a first interface between the adhesion barrier layer and the dielectric layer. A stress-reducing barrier layer is formed over the adhesion barrier layer. The stress-reducing barrier layer reduces the first stress level to provide a second stress level, less than the first stress level, across a second interface between the adhesion barrier layer, the stress-reducing barrier layer, and the dielectric layer. A metal layer is formed over the stress-reducing barrier layer. The metal layer, adhesion barrier layer, and stress-reducing barrier layer define an interconnect metal stack. Recesses are defined in the interconnect metal stack to expose the dielectric layer. The recesses are filled with a dielectric material, wherein a portion of the interconnect metal stack disposed between adjacent recessed filled with dielectric material defines an interconnect structure.

20 Claims, 8 Drawing Sheets

SUBTRACTIVE METAL MULTI-LAYER BARRIER LAYER FOR INTERCONNECT STRUCTURE

CROSS-REFERENCE TO RELATED APPLICATIONS

Not applicable.

BACKGROUND

The disclosed subject matter relates generally to the field of semiconductor device manufacturing, and more particularly, to a subtractive metal multi-layer barrier layer for an interconnect structure.

A conventional integrated circuit device, such as a microprocessor, is typically comprised of many thousands of semiconductor devices, e.g., transistors, formed above the surface of a semi-conductive substrate. For the integrated circuit device to function, the transistors must be electrically connected to one another through conductive interconnect structures. The back end of line (BEOL) is the second portion of integrated circuit fabrication where the individual devices (transistors, capacitors, resistors, etc.) get interconnected with wiring on device. BEOL generally begins when the first layer of metal is deposited on the wafer. It includes contacts, insulating layers (dielectrics), metal levels, and bonding sites for chip-to-package connections. Many modern integrated circuit devices are very densely packed, i.e., there is very little space between the transistors formed above the substrate. Thus, these conductive interconnect structures must be made in multiple layers to conserve plot space on the semiconductor substrate.

The conductive interconnect structures are typically accomplished through the formation of a plurality of conductive lines and conductive plugs, commonly referred to as contacts or vias, formed in alternative layers of dielectric materials formed on the device. As is readily apparent to those skilled in the art, the conductive plugs are means by which various layers of conductive lines, and/or semiconductor devices, may be electrically coupled to one another. The conductive lines that connect the various interconnect structures are commonly formed in trenches defined in the dielectric layers.

A contact is generally used to define an interconnect structure (e.g., using polysilicon or metal) to an underlying polysilicon layer (e.g., source/drain or gate region of a transistor), while a via denotes a metal to metal interconnect structure. In either case, a contact opening is formed in an insulating layer overlaying the conductive member. A second conductive layer is then formed over the contact opening and electrical communication is established with the conductive member.

One technique for reducing the size of the features formed on the semiconductor device involves the use of copper for the lines and interconnections in conjunction with new dielectric materials having lower dielectric constants than previously achievable with common dielectric material choices. Standard dielectric materials such as silicon dioxide, TEOS, and F-TEOS have dielectric constants greater than 3. The new dielectric materials, commonly referred to as low-k dielectrics, have dielectric constants less than 3, and thus, allow greater device densities, due to their more efficient isolation capabilities. One such low-k dielectric is sold under the name of Black Diamond, by Applied Materials, Inc.

Typical interconnect features include a metal stack including three materials, a barrier layer, a seed layer, and bulk fill. The barrier layer serves to inhibit migration or diffusion of copper into the dielectric and also to inhibit oxygen diffusion from the dielectric into the interconnect feature. The barrier layer may also improve wettability of copper over the topography to minimize agglomeration, thus potentially eliminating the need for a separate liner layer. The seed layer provides favorable surface to nucleate islets for copper grain growth, protects the barrier material from attack in the copper plating bath, and provides a dopant material for diffusion into the copper to mitigate electromigration (EM) and stress migration (SM).

In a narrow BEOL pitch, the barrier and seed layers must be relatively thin to accommodate the geometry while leaving enough room for the bulk copper fill. Due to continuous scaling to smaller dimensions, it becomes more difficult to create barrier and seed layers that are capable of performing their functions.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF EMBODIMENTS

The following presents a simplified summary of only some aspects of embodiments of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes forming an adhesion barrier layer over a dielectric layer formed on a substrate. A first stress level is present across a first interface between the adhesion barrier layer and the dielectric layer. A stress-reducing barrier layer is formed over the adhesion barrier layer. The stress-reducing barrier layer reduces the first stress level to provide a second stress level, less than the first stress level, across a second interface between the adhesion barrier layer, the stress-reducing barrier layer, and the dielectric layer. A metal layer is formed over the stress-reducing barrier layer. The metal layer, adhesion barrier layer, and stress-reducing barrier layer define an interconnect metal stack. Recesses are defined in the interconnect metal stack to expose the dielectric layer. The recesses are filled with a dielectric material, wherein a portion of the interconnect metal stack disposed between adjacent recessed filled with dielectric material defines an interconnect structure.

BRIEF DESCRIPTION OF THE SEVERAL VIEWS OF THE DRAWINGS

The disclosed subject matter will hereafter be described with reference to the accompanying drawings, wherein like reference numerals denote like elements, and.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
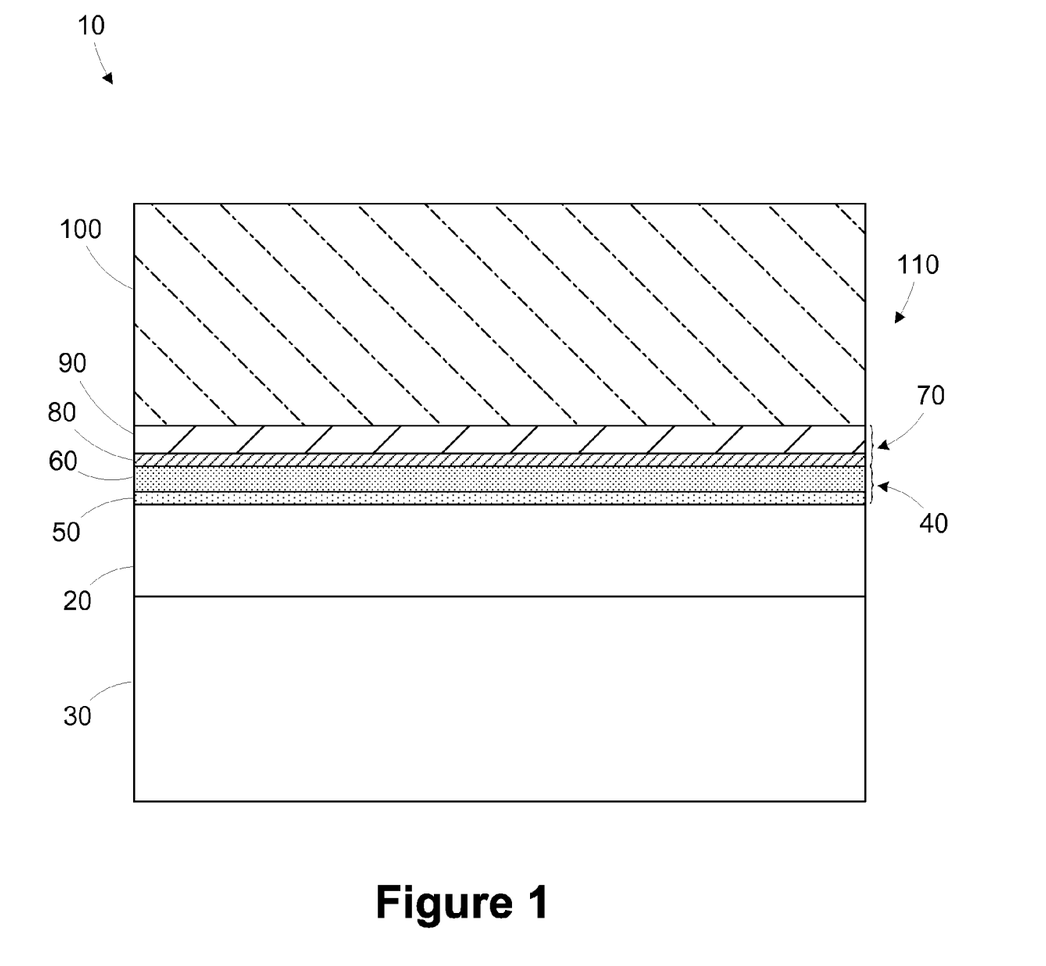
FIG. 1 is a cross section view of a partially completed interconnect structure including an interconnect metal stack.

Referring now to the drawings wherein like reference numbers correspond to similar components throughout the several views and, specifically, referring to FIG. 1, the disclosed subject matter shall be described in the context of a method for fabricating an interconnect structure. FIG. 1 is a cross-section view of a partially completed interconnect structure 10. A dielectric layer 20 has been provided on a substrate 30. In the illustrated embodiment, the dielectric layer 29 is an interlayer dielectric layer disposed between a device layer or metallization layer and another metallization layer. In one embodiment, the dielectric layer 20 may have a low dielectric coefficient, commonly referred to as a low-k dielectric. One such suitable low-k dielectric material is Black Diamond, offered by Applied Materials, Inc.

A barrier layer stack 40 is formed above the dielectric layer 20. The barrier layer stack 40 includes an adhesion barrier layer 50 and a stress-reducing barrier layer 60. The adhesion barrier layer 50 provides good adhesion between the dielectric layer 20 and the metal interconnect structure 10. Exemplary adhesion barrier materials include tantalum (Ta) or tantalum nitride (TaN), which may be formed by physical vapor deposition (PVD) or atomic layer deposition (ALD) processes known in the art. An exemplary material for the stress-reducing barrier layer 60 includes an alloy of tantalum and a transition metal (TaMx), which may be formed using a PVD process. Exemplary transition metals could include any element in the d-block of the periodic table, which includes groups 3 to 12 on the periodic table. In the illustrated embodiment, titanium (Ti) is used to form the alloy with tantalum (Ta) in the stress-reducing barrier layer 60. The use of a TaMx alloy reduces the overall resistance of the barrier layer stack 40, and also reduces the likelihood of pipe diffusion for copper.

The TaMx alloy in the stress-reducing barrier layer 60 reduces stress in the interconnect structure 10 by reducing the delta stress. Delta stress is the absolute value of stress in the metal film stack (Cu fill plus any barrier) minus stress in the low-k dielectric layer 20. The use of the adhesion barrier layer 50 provides the opportunity to modulate the delta stress. The stress-reducing barrier layer 60 is engineered to reduce the stress present in the adhesion barrier layer 50 across the interface with the dielectric layer 20, thereby also reducing the net delta stress. Hence, stress level present across the interface between the adhesion barrier layer 50 and the dielectric layer 20 is changed by the stress-reducing barrier layer 60 to provide a reduced stress level across the interface between the adhesion barrier layer 50, the stress-reducing barrier layer 60, and the dielectric layer 20. The stress may be tensile or compressive, depending on the particular application, geometry, and materials. The stress reduction reduces stress between the layers 50, 60 and also the stress at critical interfaces of the interconnect structure 10, such as the interfaces at corner regions. Thus, the stress-reducing barrier layer 60 serves to reduce the stress differential across the interconnect/dielectric interface. The percentages of tantalum and transition metal, Mx, in the stress-reducing barrier layer 60 may be about 60-93% and 7-40%, respectively.

As illustrated in FIG. 1, a seed layer stack 70 is formed over the barrier layer stack 40. The seed layer stack 70 includes an undoped seed layer 80 and a doped seed layer 90. In the illustrated embodiment, the seed layer 80 is undoped copper, and the doped seed layer 90 may be a copper alloy such as copper-manganese (CuMn). Other alloy metals for the doped seed layer 90 include aluminum, gold, calcium, zinc, cadmium, silver, tin, etc.

A bulk metal layer 100 is formed over the seed layer stack 70. In the illustrated embodiment, the bulk metal layer 100 is copper formed using an electroplating process or a PVD copper process with or without reflow. The barrier layer stack 40, seed layer stack 70, and metal layer 100 define an interconnect metal stack 110.

Figure 2:
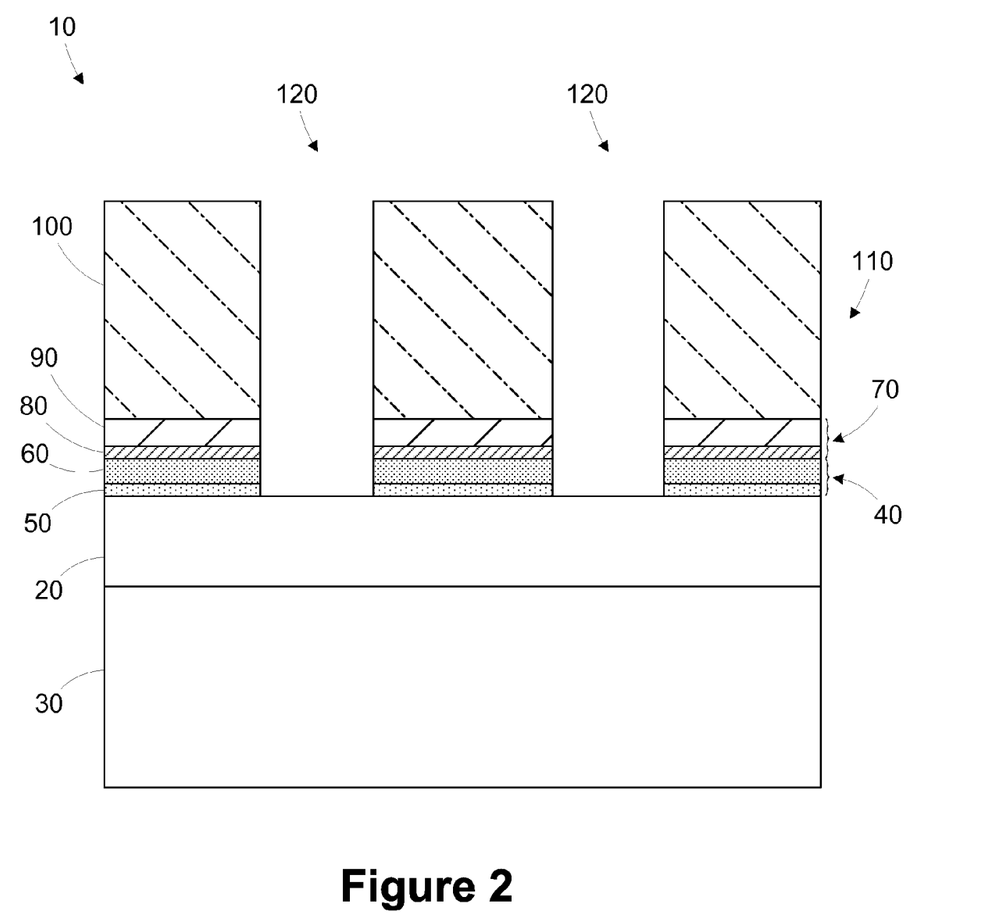
FIG. 2 is a cross-section view of the structure of FIG. 1 illustrating the formation recesses in the interconnect metal stack.
Figure 3:
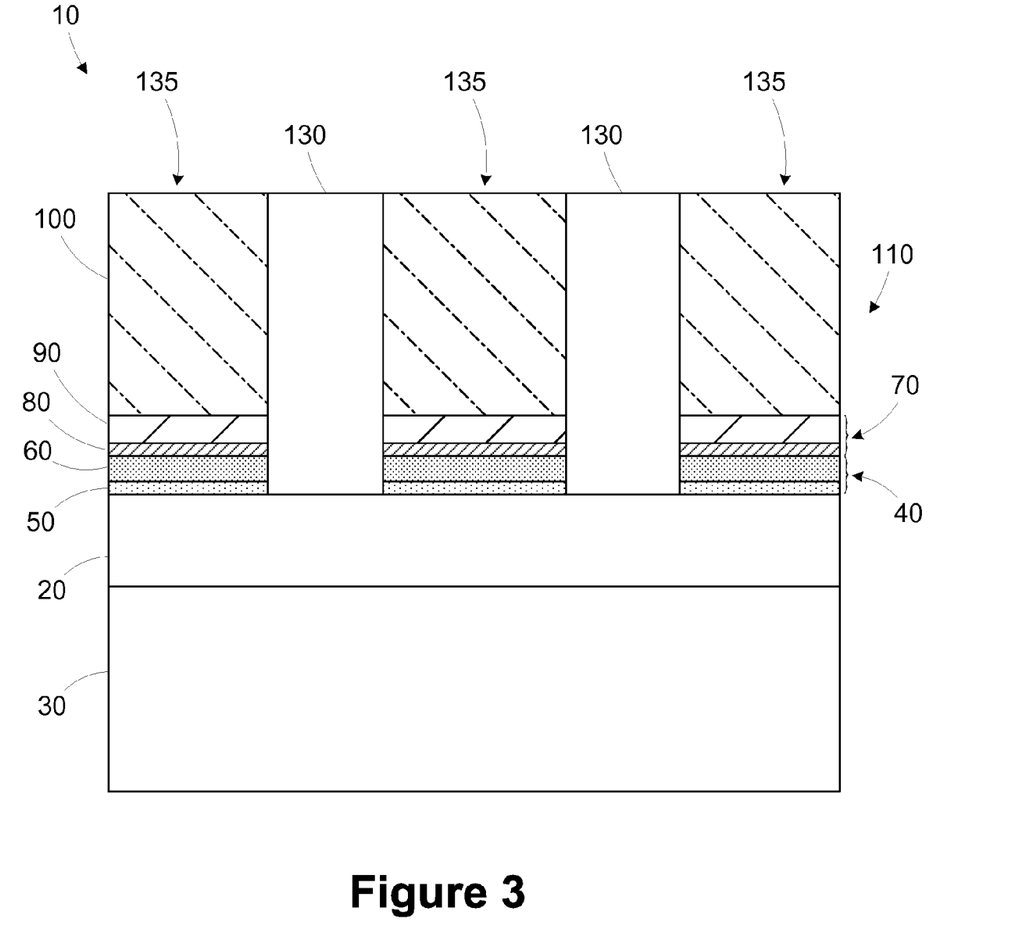
FIG. 3 is a cross-section view of the structure of FIG. 2 illustrating the filling of the recesses to define interconnect structures.

As illustrated in FIG. 2, recesses 120, such as trenches or vias, are formed in the interconnect metal stack 110. The interconnect metal stack 110 may be patterned using a photoresist or hard mask and etched using chlorine and/or fluorine based oxidizers. The recesses 120 are filled with a dielectric material 130, as shown in FIG. 3. The dielectric material 130 may be formed using a flow-able CVD silicon dioxide or a spin-on-oxide, or a combination of both. Dielectric material 130 extending above the surface of the recesses 120 may be removed using chemical mechanical planarization process. Portions of the interconnect metal stack 110 defined between adjacent regions of dielectric material 130 define interconnect features 135, such as trenches or vias that may be used for intra-layer or inter-layer interconnections.

In the embodiment of FIG. 3, the dielectric material 130 interfaces with the bulk metal layer 100. To mitigate electromigration or stress migration of the material of the bulk metal layer 100, the dielectric material 130 may be formed from a different material than the dielectric layer 20. For example, the dielectric material 130 may include nitrogen. A nitrided dielectric material acts as barrier layer. The dielectric material 130 may also include carbon or boron to improve flowability to cover the sidewalls of the recesses 120.

Figure 4:
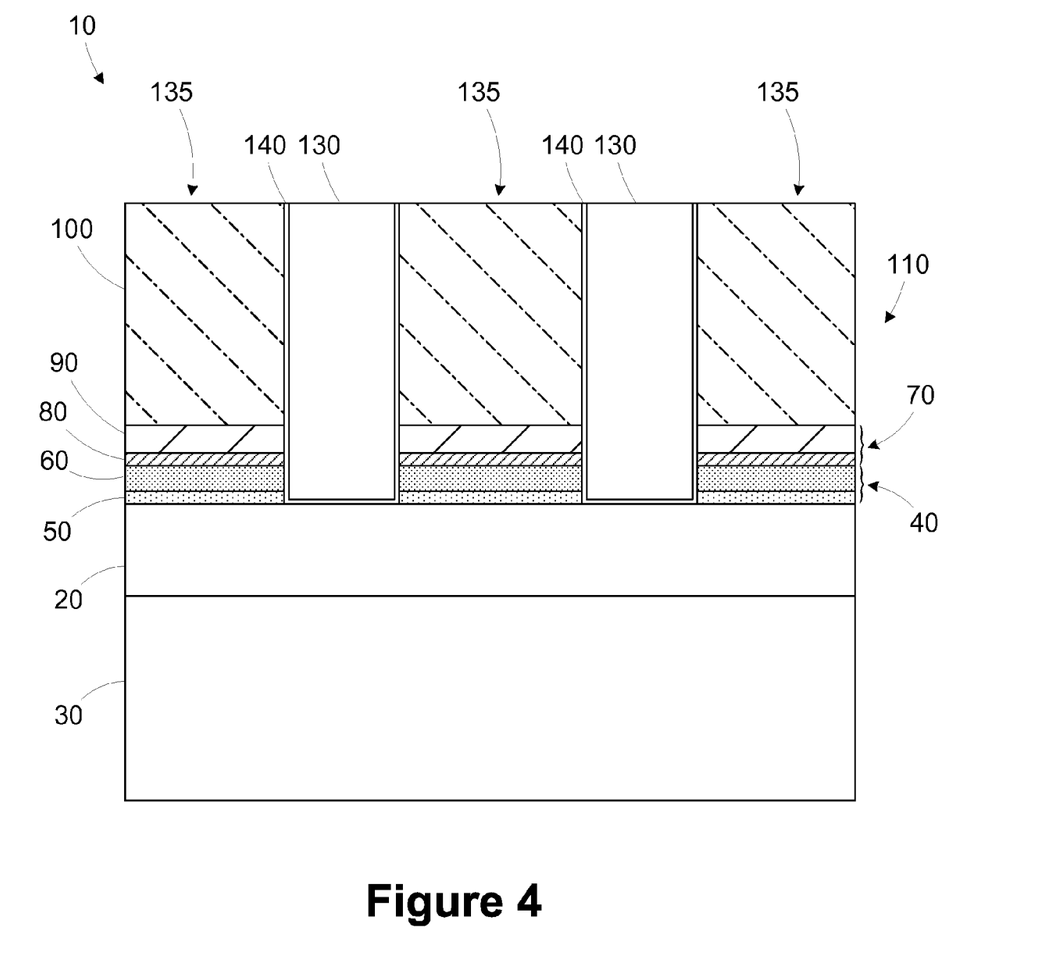
FIG. 4 is a cross-section view of the structure of FIG. 3, wherein a dielectric liner is formed to line the recesses.

As illustrated in FIG. 4, the recesses 120 may be lined with a barrier layer 140 prior to filling the recesses with the dielectric material 130 for embodiments where the dielectric material 130 does not include a barrier type material. Exemplary materials for the barrier layer 140 are silicon nitride, manganese silicate, and aluminum silicate, or other suitable barrier materials. In cases, where the barrier layer 140 is conductive it may be removed from the bottom of the recesses using an etch process, such as a sputter etch.

Figure 5:
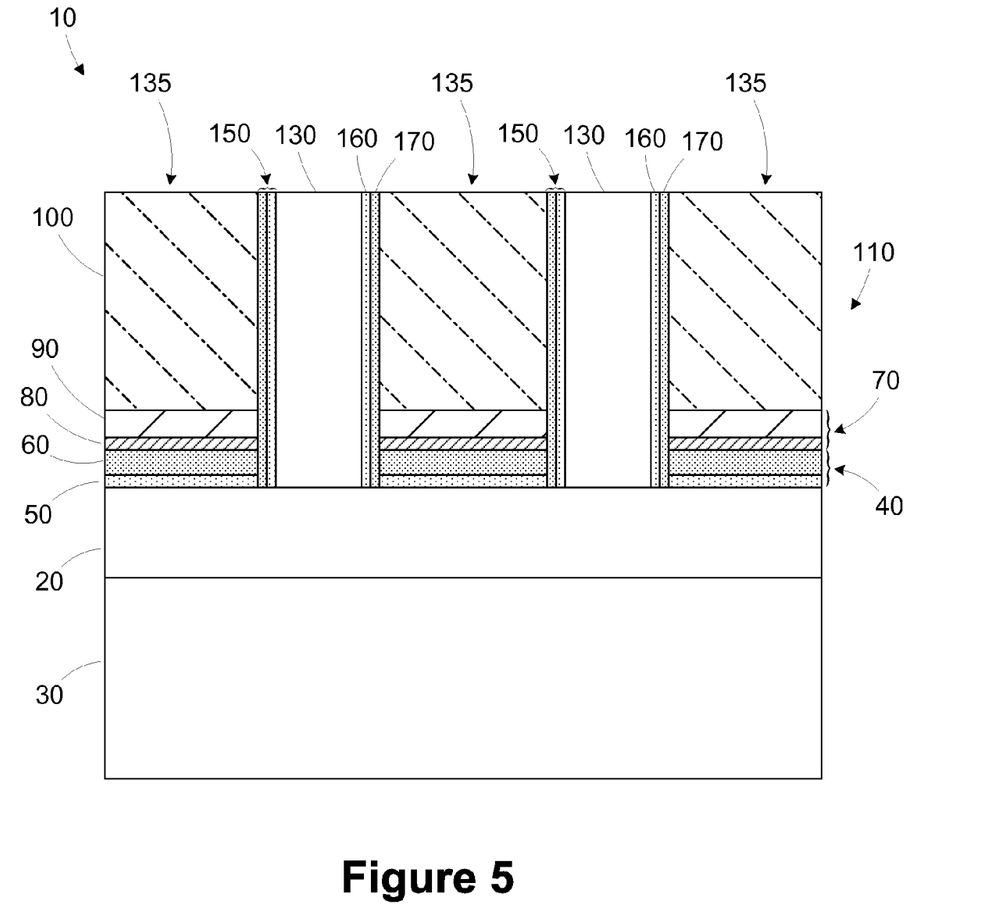
FIG. 5 is a cross-section view of the structure of FIG. 3 wherein a barrier layer stack is formed to line the recesses.

In some embodiments, a barrier may be formed using a barrier layer stack 150, as illustrated in FIG. 5. The barrier layer stack 150 may be similar to the barrier layer stack 40, and may include a stress-reducing barrier layer 160 (e.g., TaMx) and an adhesion barrier layer 170 (e.g., Ta or TaN), as described above in reference to FIG. 1. Any portion of the barrier layer stack 150 disposed on a bottom of the recesses 120 may be removed using a sputter etch to avoid creating conductive paths between interconnects. The portion of the barrier layer stack 150 covering the top of the metal layer 100 may also be removed by the sputter etch. Alternatively, a selective growth technique may be used that only grows the barrier layer stack 150 on metal surfaces. In such a case, the barrier layer stack 150 may also cover the top surface.

Figure 6:
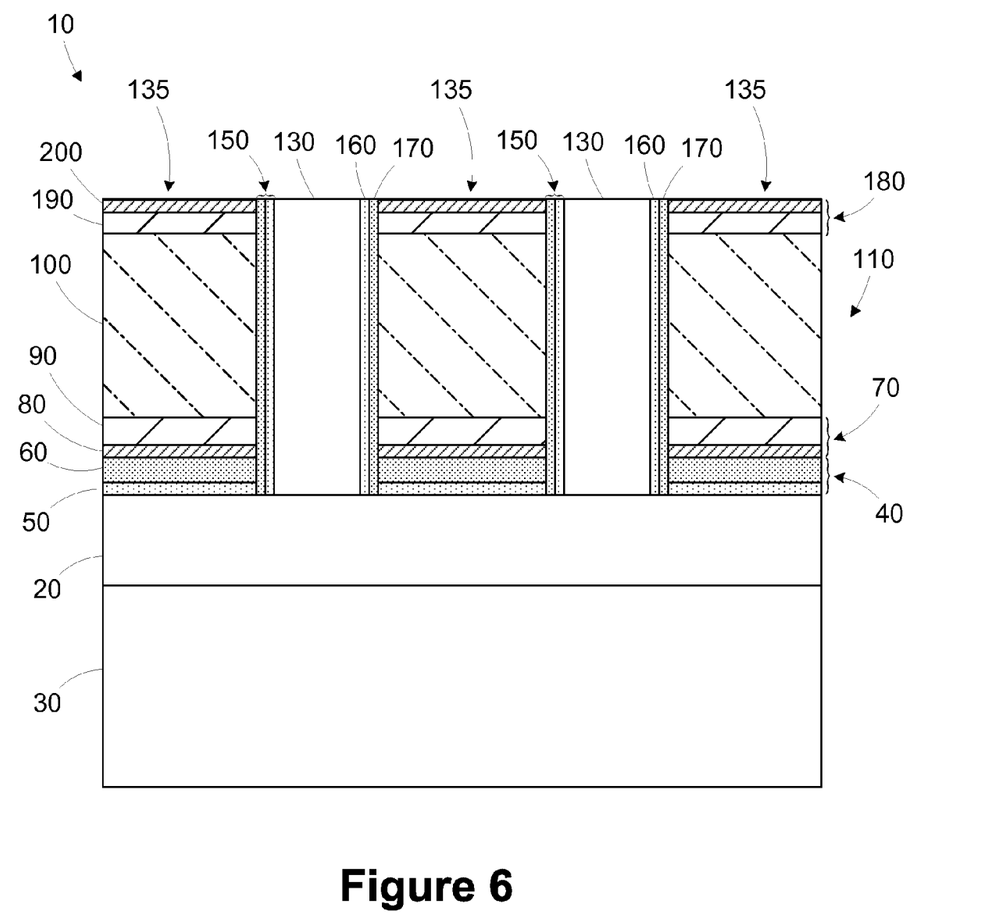
FIG. 6 is a cross-section view of the structure of FIG. 5 wherein the metal interconnect stack includes first and second seed layer stacks.

As illustrated in FIG. 6, the interconnect metal stack 110 may also include a second seed layer stack 180 including a doped seed layer 190 (e.g., CuMn, Al, Au, Ag, Ca, Zn, Cd, Sn, etc.) and an undoped seed layer 200 formed above the metal layer 100 prior to the formation of the recesses 120. The barrier layer stack 150 illustrated in FIG. 5 may also be employed to line the recesses 120 prior to the formation of the dielectric material 130. The barrier layer stack 150 may or may not cover the top surface of the seed layer stack 180 depending on the deposition technique, as described above in reference to FIG. 5.

After the formation of the dielectric material 130 to fill the recesses 120, as illustrated in FIG. 3, 4, 5, or 6, an anneal process is performed to realign the grain boundaries and increase the grain size of the metal layer 100. During the anneal process, the dopant in the doped seed layer(s) 90, 190 diffuses into the metal layer 100 to improve its EM and SM resistance. Some dopant may also diffuse into the undoped seed layer(s) 90, 200, however, the undoped seed layer(s) 90, 200 act as buffers to limit dopant diffusion into dislocations present in the barrier layer stack(s) 40, 150. An exemplary anneal process may be conducted at 100-400° C. for 30-60 min.

Figure 7:
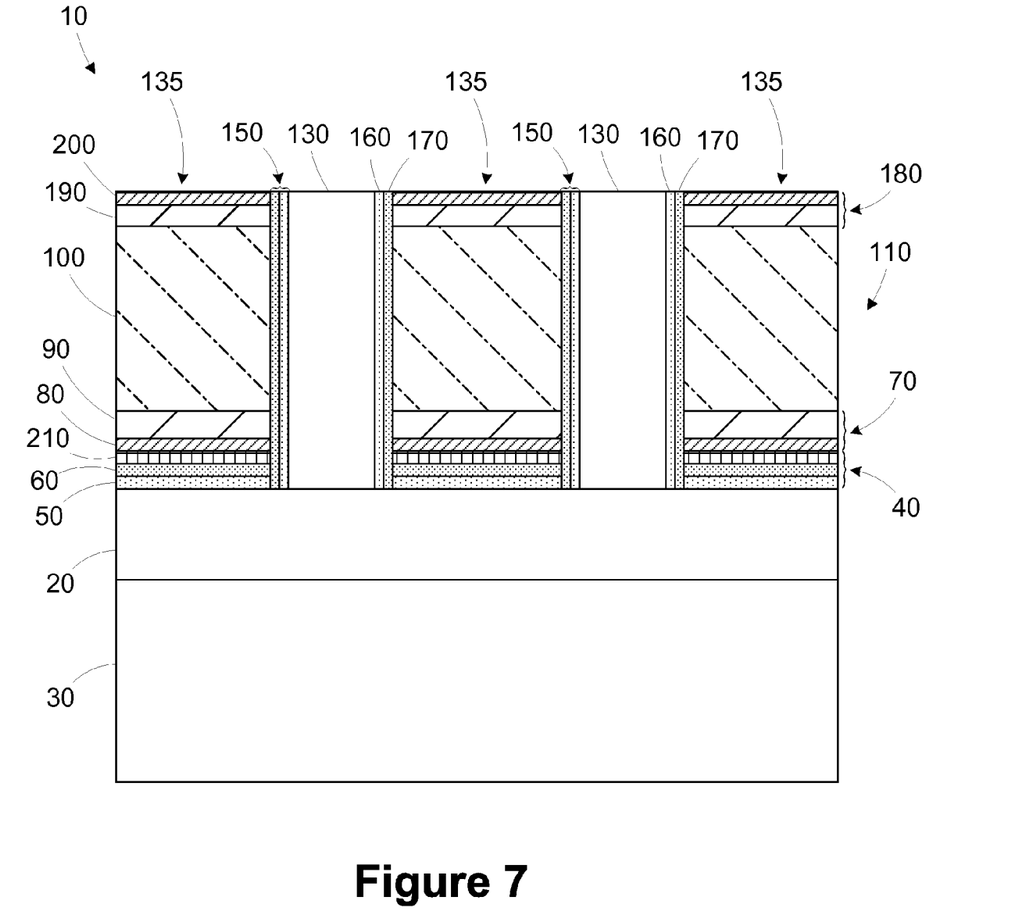
FIG. 7 is a cross-section view of the structure of FIG. 5 wherein the metal interconnect stack includes a wetting layer.

Referring to FIG. 7, an embodiment is illustrated where the barrier layer stack 40 also includes a wetting layer 210. In the illustrated embodiment, the material of the wetting layer 210 is ruthenium (Ru), but other transition metals having relatively high wettabilities for copper that may be used are osmium, rhodium, palladium, platinum, iridium, niobium, and cobalt. The wetting layer 210 acts as a seed enhancement layer to improve the copper seed coverage, thereby enhancing the process for forming the metal layer 100. The wetting layer 210 allows direct copper plating of the seed layer stack 70. The wetting layer 210 may be used with any of the embodiments of FIGS. 3-6.

Figure 8:
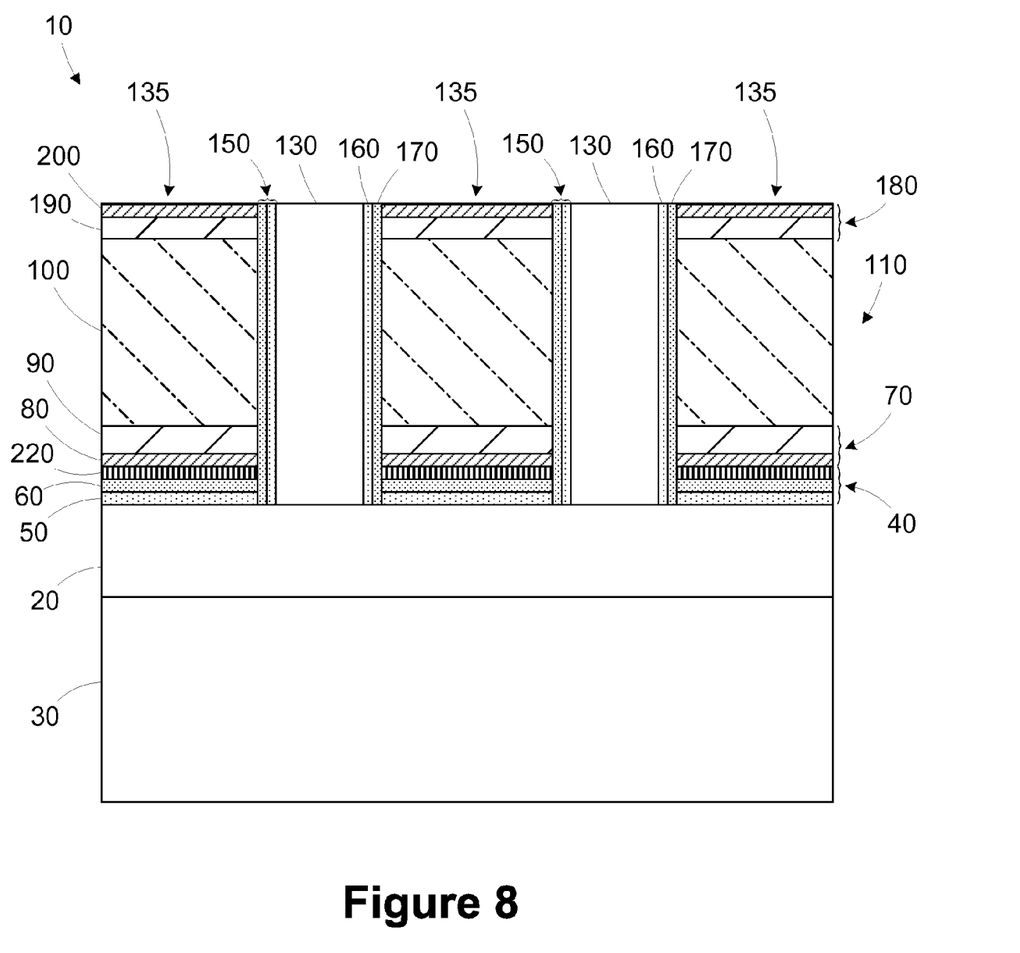
FIG. 8 is a cross-section view of the structure of FIG. 7 illustrating an anneal process that results in an alloy formed in the wetting layer.

As illustrated in FIG. 8, during the anneal process performed after the metal layer 100 has been formed, transition metal from the stress-reducing barrier layer 60 diffuses into the wetting layer 210, creating an alloy layer 220 (e.g., RuTi). The alloy serves to change the characteristics of the wetting layer 210 to improve its efficacy as a barrier layer for mitigating EM and SM. This change increases the overall effectiveness of the barrier layer stack 40, while also providing an advantage during the formation of the metal layer 100.

The use of the multiple layer barrier layer stack 40, 150 and the seed layer stack 70, 180 as described herein provides process advantages and reliability advantages (i.e., EM and SM resistance). The stress gradient across the interconnect/dielectric interface is reduced in both the barrier layer stack 40, 150 and the seed layer stack 70, 180.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:
1. A method, comprising:
    forming an adhesion barrier layer over a dielectric layer formed on a substrate, wherein a first stress level is present across a first interface between the adhesion barrier layer and the dielectric layer;
    forming a stress-reducing barrier layer over the adhesion barrier layer, wherein the stress-reducing barrier layer reduces the first stress level to provide a second stress level, less than the first stress level, across a second interface between the adhesion barrier layer, the stress-reducing barrier layer, and the dielectric layer;
    forming a metal layer over the stress-reducing barrier layer, wherein the metal layer, adhesion barrier layer, and stress-reducing barrier layer define an interconnect metal stack;

defining recesses in the interconnect metal stack to expose the dielectric layer; and filling the recesses with a dielectric material, wherein a portion of the interconnect metal stack disposed between adjacent recessed filled with dielectric material defines an interconnect structure.

2. The method of claim 1, wherein the stress-reducing barrier layer comprises an alloy of tantalum and a transition metal other than tantalum.

3. The method of claim 2, wherein the transition metal comprises titanium.

4. The method of claim 1, wherein forming the metal layer further comprises:
   forming a first seed layer over the stress-reducing barrier layer;
   forming a first doped seed layer over the first seed layer, wherein the first doped seed layer comprises a first dopant not present in the first seed layer;
   forming the metal layer over the first doped seed layer; and
   annealing the substrate, wherein the first dopant diffuses into the metal layer during the annealing.

5. The method of claim 4, wherein the first dopant comprises manganese.

6. The method of claim 4, further comprising:
   forming a second doped seed layer over the metal layer prior to annealing the substrate; and
   forming a second seed layer over the second doped seed layer prior to annealing the substrate, wherein the second doped seed layer comprises a second dopant not present in the second seed layer and the second dopant diffuses into the metal layer during the annealing.

7. The method of claim 1, wherein forming the metal layer further comprises:
   forming a wetting layer above the stress-reducing barrier layer; and
   forming the metal layer above the wetting layer.

8. The method of claim 7, wherein the wetting layer comprises ruthenium.

9. The method of claim 7, wherein the stress-reducing barrier layer comprises an alloy of tantalum and a transition metal other than tantalum, and the method further comprises annealing the substrate, wherein the transition metal diffuses into the wetting layer to form an alloy layer during the annealing.

10. The method of claim 9, wherein the wetting layer comprises ruthenium and the transition metal comprises titanium.

11. The method of claim 7, wherein the stress-reducing barrier layer comprises an alloy of tantalum and a transition metal other than tantalum, and the method further comprises annealing the substrate, wherein the transition metal diffuses into the wetting layer to form an alloy layer during the annealing.

12. The method of claim 11, wherein the wetting layer comprises ruthenium and the transition metal comprises titanium.

13. The method of claim 1, wherein the metal layer comprises copper.

14. The method of claim 1, wherein the adhesion barrier layer comprises tantalum.

15. The method of claim 1, wherein the interconnect structure comprises at least one of a trench or a via.

16. The method of claim 1, further comprising forming a barrier layer lining the recesses prior to filling the recesses.

17. The method of claim 16, wherein the barrier layer comprises a conductive material, and the method further comprises removing the barrier layer from bottom surfaces of the recesses.

18. The method of claim 1, wherein the dielectric material comprises a barrier material.

19. The method of claim 1, further comprising:
   forming a second stress-reducing barrier layer lining the recesses;
   forming a second adhesion barrier layer over the second stress-reducing barrier layer; and
   removing portions of the second stress-reducing barrier layer and the second adhesion barrier layer disposed in bottom portions of the recesses prior to filling the recesses.

20. The method of claim 19, further comprising:
   forming a second doped seed layer over the metal layer prior to forming the recesses;
   forming a second seed layer over the second doped seed layer prior to forming the recesses, wherein the second doped seed layer comprises a second dopant not present in the second seed layer; and
   annealing the substrate, wherein the first and second dopants diffuse into the metal layer during the annealing.

* * * * *